United States Patent
Kuri et al.

(10) Patent No.: US 11,669,010 B2
(45) Date of Patent: Jun. 6, 2023

(54) EJECTION MATERIAL EJECTING DEVICE AND IMPRINT APPARATUS

(71) Applicant: CANON KABUSHIKI KAISHA, Tokyo (JP)

(72) Inventors: Masahiro Kuri, Utsunomiya (JP); Noriyasu Hasegawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 200 days.

(21) Appl. No.: 16/822,647

(22) Filed: Mar. 18, 2020

(65) Prior Publication Data

US 2020/0341367 A1  Oct. 29, 2020

(30) Foreign Application Priority Data

Apr. 26, 2019  (JP) .............................. JP2019-085554

(51) Int. Cl.
   *G03F 7/00* (2006.01)
   *H01L 21/67* (2006.01)

(52) U.S. Cl.
   CPC ........ *G03F 7/0002* (2013.01); *H01L 21/6715* (2013.01)

(58) Field of Classification Search
   CPC . H01L 21/6715; B29C 59/002; B29C 64/209; B29C 64/25; B29C 64/259; G03F 7/0002; G03F 7/003; B41J 2002/14491; B41J 2/16; B41J 2/14; B41J 2002/14
   USPC .......................................... 425/385
   See application file for complete search history.

(56) References Cited

U.S. PATENT DOCUMENTS

| | | | |
|---|---|---|---|
| 6,202,915 B1 | 3/2001 | Sato | |
| 6,241,340 B1 * | 6/2001 | Watanabe | B41J 2/14072 347/50 |
| 2011/0243580 A1 * | 10/2011 | Matsukawa | G03G 21/1652 399/13 |
| 2017/0326583 A1 * | 11/2017 | Ito | B05C 11/10 |

FOREIGN PATENT DOCUMENTS

| | | |
|---|---|---|
| JP | 10-44418 A | 2/1998 |
| JP | 11-149951 A | 6/1999 |
| JP | 2000-176654 A | 6/2000 |
| JP | 2007-227856 A | 9/2007 |
| JP | 2008-147379 A | 6/2008 |
| JP | 5473728 B2 | 4/2014 |

(Continued)

OTHER PUBLICATIONS

Fibre Briefing: Polyester (Year: 2021).*

(Continued)

*Primary Examiner* — Larry W Thrower
*Assistant Examiner* — John W Hatch
(74) *Attorney, Agent, or Firm* — Venable LLP

(57) ABSTRACT

An ejection material ejecting device includes: an ejection unit including an ejection opening configured to eject an ejection material; an electric substrate configured to control ejection of the ejection material; a first flexible cable connected to the ejection unit; a second flexible cable connected to the electric substrate; and a joint at which the first flexible cable and the second flexible cable are joined by an anisotropic conductive film, wherein the joint is covered with a sealant resistant to the ejection material.

16 Claims, 6 Drawing Sheets

(56) References Cited

FOREIGN PATENT DOCUMENTS

JP 2016-164961 A 9/2016
KR 10-2017-0074944 A 6/2017

OTHER PUBLICATIONS

Cable Definition & Meaning (Year: 2022).*
Silicon—Wikipedia (Year: 2022).*
Fluoroplastics, vol. 1—Non-Melt Processable Fluoropolymers—The Definitive User's Guide and Data Book (2nd Edition) (Year: 2015).*
52nd AIAA/SAE/ASEE Joint Propulsion Conference, Salt Lake City, UT, Jul. 25-27, 2016 (Year: 2016).*
Fibre Briefing: Polyester (Year: 2015).*
Silicone—Wikipedia, Paragraph: Physical and Atomic, Mar. 29, 2019 (Year: 2019).*
Cable Definition: Collins English Dictionary—Complete & Unabridged 2012 Digital Edition (Year: 2012).*
Request for the Submission of an Opinion in Korean Application No. 10-2020-0049260 (dated Aug. 2022).
Notice of Reasons for Refusal in Japanese Application No. 2019-085554 (dated Mar. 2023).
JP 2000-176654, U.S. Pat. No. 6,202,915 B1.
JP 2016-164961, U.S. Patent Application Publication No. 2017/0326583 A1.

* cited by examiner

EJECTION MATERIAL EJECTING DEVICE AND IMPRINT APPARATUS

BACKGROUND OF THE DISCLOSURE

Field of the Disclosure

The present disclosure relates to an ejection material ejecting device and an imprint apparatus.

Description of the Related Art

As an ejecting device of an ejection material, there is an ejecting device configured to eject a liquid or an ejection material in a liquid state stored in a storage container from an ejection opening. An ejection unit having the ejection opening is electrically connected to a wiring substrate (electric substrate) for ejection control.

Japanese Patent Laid-Open No. H10-44418 discloses a recording head wherein a flexible film wiring substrate and a wiring substrate are electrically connected to each other by hot pressing using an anisotropic conductive membrane.

The electric substrate is often required to be arranged at a certain distance from the ejection unit. Thus, a plurality of wiring members are often joined using an anisotropic conductive membrane as disclosed in Japanese Patent Laid-Open No. H10-44418 such that the ejection unit and the electric substrate are electrically connected to each other via the wiring members. However, in a case where the ejection material enters into the joint between the wiring members, there is a possibility that the joint is released and the electrical connection cannot be maintained.

SUMMARY OF THE DISCLOSURE

An ejection material ejecting device according to this disclosure comprises: an ejection unit comprising an ejection opening configured to eject an ejection material; an electric substrate configured to control ejection of the ejection material; a first wiring member connected to the ejection unit; a second wiring member connected to the electric substrate; and a joint at which the first wiring member and the second wiring member are joined by an anisotropic conductive material, wherein the joint is covered with a sealant resistant to the ejection material.

DESCRIPTION OF THE EMBODIMENTS

Exemplary embodiments will be hereinafter described in detail with reference to the attached drawings.

First Embodiment

[Imprint Apparatus]

Figure 1:
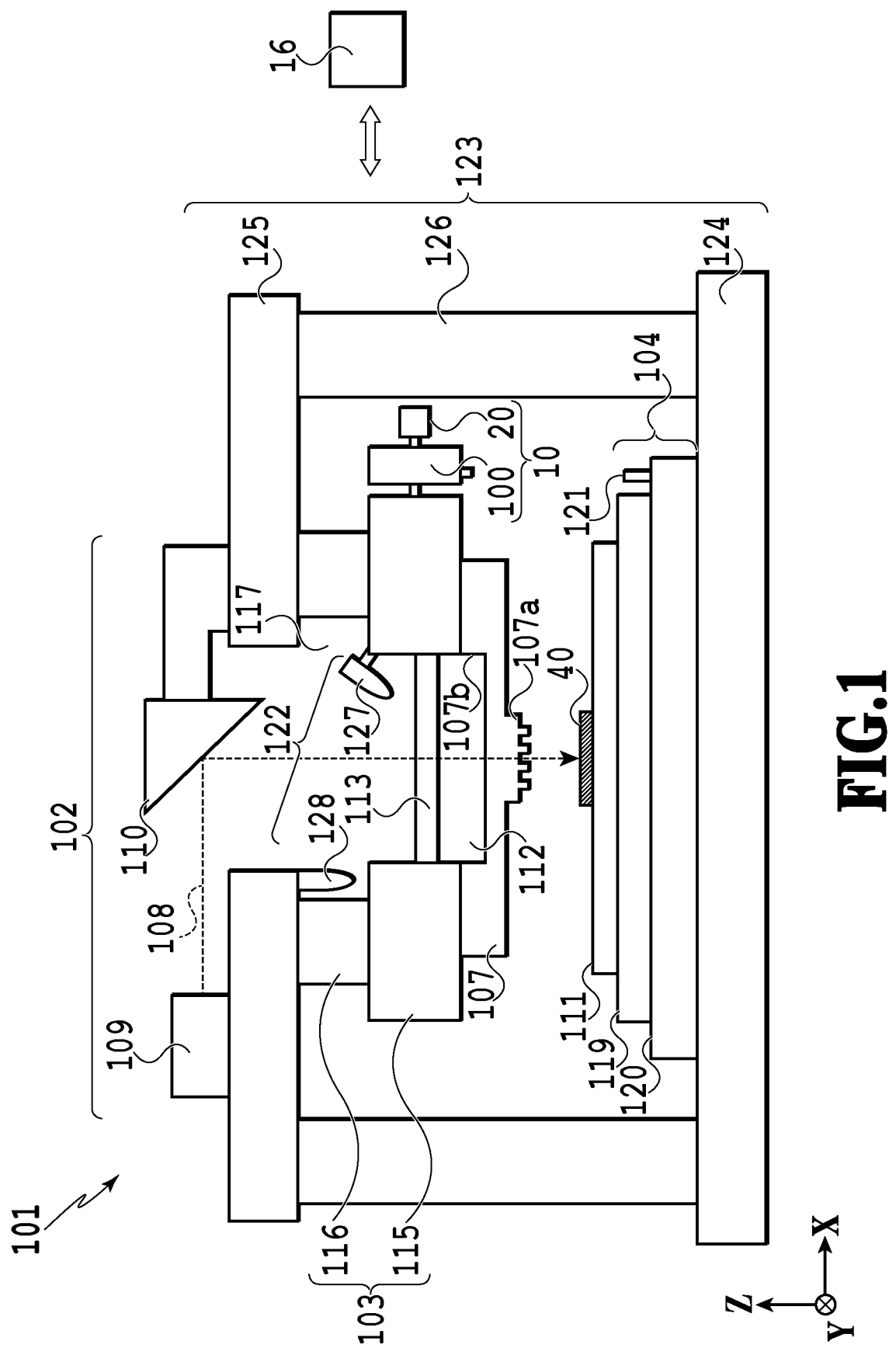
FIG. 1 is a diagram showing a configuration of an imprint apparatus.

FIG. 1 is a schematic diagram showing a configuration of an imprint apparatus. An imprint apparatus 101 is used to manufacture various devices such as a semiconductor device. An uncured resin (also referred to as a resist or an imprint material) 40 is applied to a substrate 111. The uncured resin 40 is ejected by an ejection material ejecting device 10 to be described later and is therefore also referred to as an ejection material. The imprint apparatus 101 presses a mold 107 having a pattern for molding against the uncured imprint material 40 and cures the imprint material 40 in this state by light (ultraviolet light) irradiation. After that, the mold 107 is removed from the cured imprint material 40, whereby the imprint apparatus 101 performs imprint processing of transferring the pattern of the mold 107 to the substrate 111.

The imprint material 40 is a photo-curable resin having the property of being cured by receiving ultraviolet light 108. The imprint material is appropriately selected depending on various conditions such as a semiconductor device manufacturing process. Instead of the photo-curable imprint material, for example, a thermosetting imprint material may be used and the imprint apparatus may perform imprint processing by curing the imprint material by heat.

The imprint apparatus 101 comprises a light irradiating unit 102, a mold holding mechanism 103, a substrate stage 104, the ejection material ejecting device 10, a control unit 16, a measuring unit 122, and a housing 123.

The light irradiating unit 102 comprises a light source 109 and an optical element 110 for correcting the ultraviolet light 108 emitted from the light source 109. For example, the light source 109 is a halogen lamp configured to generate i-line or g-line. The imprint material 40 is irradiated with the ultraviolet light 108 via a mold 107. The wavelength of the ultraviolet light 108 depends on the imprint material 40 to be cured. In a case where the imprint apparatus uses a thermosetting imprint material as the imprint material, the light irradiating unit 102 is replaced with a heat source for curing the thermosetting imprint material.

The mold holding mechanism 103 comprises a mold chuck 115 and a mold driving mechanism 116. The mold 107 held by the mold holding mechanism 103 has a rectangular outer shape. A surface of the mold 107 facing the substrate 111 comprises a pattern portion 107a in which an uneven pattern to be transferred such as a circuit pattern is three-dimensionally formed. In the present embodiment, the mold 107 is formed of a material that allows the ultraviolet light 108 to pass through. For example, quartz is used as the material.

The mold chuck 115 holds the mold 107 by vacuum suction or electrostatic force. The mold driving mechanism 116 moves the mold 107 by holding and moving the mold chuck 115. The mold driving mechanism 116 can move the mold 107 in a −Z direction to press the mold 107 against the imprint material 40. The mold driving mechanism 116 can also move the mold 107 in a Z direction to remove the mold 107 from the imprint material 40. An actuator usable as the mold driving mechanism 116 is, for example, a linear motor or an air cylinder.

The mold chuck 115 and the mold driving mechanism 116 have an opening region 117 at the center. A surface of the mold 107 irradiated with the ultraviolet light 108 has a cavity 107b of a recessed shape. In the opening region 117 of the mold driving mechanism 116, a light transmissive member 113 is provided. The light transmissive member 113, the cavity 107b, and the opening region 117 form a sealed space 112. A pressure in the space 112 is controlled by a pressure correction device (not shown). The pressure correction device sets the pressure in the space 112 to be higher than the external pressure, whereby the pattern portion 107a is warped toward the substrate 111. This brings the center of the pattern portion 107a into contact with the imprint material 40. Thus, in the case of pressing the mold 107 against the imprint material 40, gas (air) can be prevented from being trapped between the pattern portion 107a and the imprint material 40, with the result that the uneven portion of the pattern portion 107a can be completely filled with the imprint material 40. The depth of the cavity 107b, which determines the size of the space 112, is appropriately changed according to the size or material of the mold 107.

The substrate stage 104 comprises a substrate chuck 119, a substrate stage housing 120, and a stage reference mark 121. The substrate 111 held by the substrate stage is a monocrystalline silicon substrate or a silicon on insulator (SOI) substrate. The imprint material 40 is applied to a surface to be treated of the substrate 111 and the pattern is molded thereon.

The substrate chuck 119 holds the substrate 111 by vacuum suction. The substrate stage housing 120 moves the substrate 111 by moving the substrate chuck 119 in X and Y directions while holding the substrate chuck 119 using mechanical means. The stage reference mark 121 is used to set a reference position of the substrate 111 in alignment of the substrate 111 and the mold 107 before the mold 107 contacts the imprint material 40 on the substrate 111. An actuator of the substrate stage housing 120 is, for example, a linear motor.

The ejection material ejecting device 10 (hereinafter referred to as the ejecting device) is a device configured to eject the uncured imprint material 40 as the ejection material and apply the material on the substrate 111. The ejecting device 10 comprises an ejection material storage unit 100 and a pressure control unit 20 configured to control a pressure in a storage container of the ejection material storage unit 100. The ejection material storage unit 100 comprises a storage container 19 (see FIG. 2) storing the ejection material and an ejection unit 13 (see FIG. 2) mounted on the storage container.

The pressure control unit 20 controls the internal pressure of the storage container 19 to be more negative than the atmospheric pressure, thereby controlling the ejection unit 13 to have a pressure slightly more negative than the atmospheric pressure (external pressure). This negative pressure control forms a meniscus at an interface between the imprint material 40 and the outside air in an ejection opening 17 configured to eject the imprint material 40 (see FIG. 3) and prevents leakage (dropping) of the imprint material 40 from the ejection opening 17 at an unintended timing.

The ejecting device 10 is attachable to and detachable from the imprint apparatus 101. In a case where the ejection material stored in the storage container 19 is consumed, the ejection material storage unit 100 mounted on the ejecting device 10 can be replaced with another ejection material storage unit storing the ejection material. The configuration of the ejection material storage unit 100 will be described later in detail.

The measuring unit 122 comprises an alignment measuring instrument 127 and an observation measuring instrument 128. The alignment measuring instrument 127 measures a misalignment of the alignment mark formed on the substrate 111 and an alignment mark formed on the mold 107 in the X and Y directions. The observation measuring instrument 128 is an image capturing device such as a CCD camera and is configured to capture an image of the pattern of the imprint material 40 applied to the substrate 111 and output the image to the control unit 16 as image information.

The control unit 16 controls operation or the like of each constituent element of the imprint apparatus 101. The control unit 16 is, for example, a computer comprising a CPU, a ROM, and a RAM. The control unit 16 is connected to each constituent element of the imprint apparatus 101 via a circuit. The CPU controls each constituent element according to a control program stored in the ROM.

The control unit 16 controls operation of the mold holding mechanism 103, the substrate stage 104, and an ejection unit 105 based on measurement information of the measuring unit 122. The control unit 16 may be integrated with a different unit in the imprint apparatus 101 or may be implemented as a device separate from the imprint apparatus. The control unit 16 is not necessarily a single computer and may include a plurality of computers.

The housing 123 comprises a base surface plate 124 on which the substrate stage 104 is placed, a bridge surface plate 125 fixing the mold holding mechanism 103, and a strut 126 extending from the base surface plate 124 and supporting the bridge surface plate 125.

Next, imprint processing by the imprint apparatus 101 will be described. The control unit 16 causes a substrate conveying mechanism (not shown) to place the substrate 111 on the substrate chuck 119. After the substrate 111 is placed on the substrate chuck 119, the control unit 16 fixes the substrate 111 on the substrate chuck 119. The control unit 16 then moves the substrate stage 104 to a position in which the ejecting device 10 can eject the imprint material 40 on the substrate 111. Next, the control unit 16 generates a drive signal. Based on the drive signal, the ejecting device 10 applies the imprint material 40 to a pattern formation region on the substrate 111. Next, the control unit 16 moves the substrate stage 104 such that the pattern formation region on the substrate 111 is positioned directly below the pattern portion 107a. Next, the control unit 16 drives the mold driving mechanism 116 to press the mold 107 against the imprint material 40 on the substrate 111. Through this mold pressing process, the uneven portion of the pattern portion 107a is filled with the imprint material 40. In this state, the control unit 16 causes the light irradiating unit 102 to emit the ultraviolet light 108 from the top surface of the mold 107 to cure the imprint material 40. After the imprint material 40 is cured, the control unit 16 drives the mold driving mechanism 116 again to remove the mold 107 from the imprint material 40. By removing the mold 107, a three-dimensional pattern of the imprint material 40 corresponding to the uneven portion of the pattern portion 107a is formed on the substrate 111.

In the imprint processing, patterns are often formed on the entire region of the substrate 111. In this case, the control unit 16 moves the substrate stage 104, changes the pattern formation region, and performs the above series of operation multiple times, thereby molding a plurality of patterns of the imprint material 40 on the single substrate 111.

[Ejection Material]

It is preferable that the imprint material 40 that is the ejection material of the present embodiment contain a component W that is a polymerization compound. The imprint material 40 may further contain a component X that is a photo polymerization initiator, a non-polymerization compound Y such as a sensitizer, and a component Z that is a solvent. In the present specification, the polymerization compound means a compound that reacts with a polymerizing factor (such as a radical) generated from the photo polymerization initiator (component X) and forms a membrane of a polymer compound by a chain reaction (polymerization reaction). The polymerization compound is, for example, a radical polymerization compound. The polymerization compound that is the component W may be only one kind of polymerization compound or may include several kinds of polymerization compounds. For example, in a case where the radical polymerization compound includes a plurality of compounds having one or more acryloyl groups or methacryloyl groups, it is possible to use one including a monofunctional (meth)acrylate monomer and a polyfunctional (meth)acrylate monomer. The component Z is not particularly limited as long as it is a solvent in which the components W, X, and Y dissolve. A preferable solvent as the component Z is a solvent with a boiling point from 80 to 200° C. at normal pressure (1 atm).

[Ejection Material Storage Unit]

Figure 2:
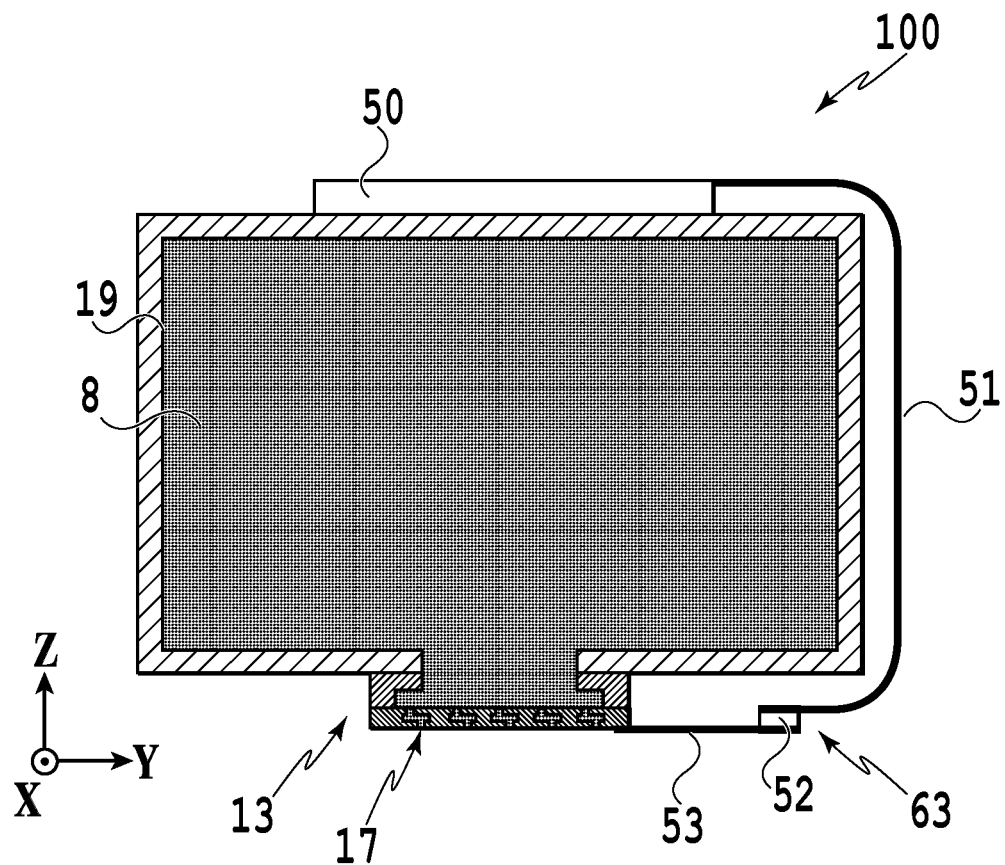
FIG. 2 is a diagram showing a configuration of an ejection material storage unit.

FIG. 2 is a schematic cross-sectional view showing a configuration of the ejection material storage unit 100 of the ejecting device 10. The ejection material storage unit 100 will be described with reference to FIG. 2. The ejection material storage unit 100 comprises the storage container 19 which stores the ejection material and the ejection unit 13 which comprises the ejection openings 17 configured to eject the imprint material 40 as the ejection material and is connected to the storage container 19. The storage container 19 comprises therein an ejection material storage chamber 8 filled with the ejection material. In a case where the ejecting device controls a pressure of the ejection material storage chamber 8 by using a hydraulic fluid, the storage container 19 comprises therein a hydraulic fluid storage chamber.

Figure 3:
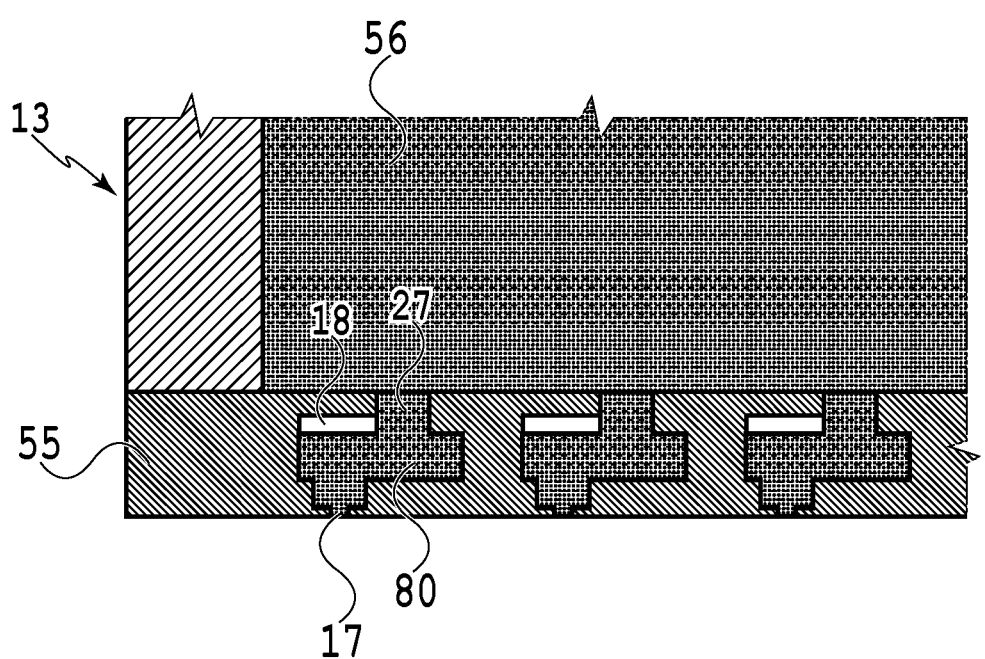
FIG. 3 is an enlarged view of an ejection unit.

FIG. 3 is an enlarged view of the vicinity of the ejection openings 17 in the ejection unit 13. The ejection unit 13 comprises a common liquid chamber 56, the ejection openings 17, individual pressure chambers 80, a module substrate 55, supply ports 27, and energy generating elements 18 arranged in the respective individual pressure chambers 80.

The common liquid chamber 56 communicates with the ejection material storage chamber 8. The individual pressure chambers 80 communicate with the common liquid chamber 56 via the supply ports 27 and are provided so as to correspond to the ejection openings 17. The imprint material 40 (ejection material) to be ejected from the ejection openings 17 flows from the ejection material storage chamber 8 through flow paths, passes through the common liquid chamber 56, and is supplied to the respective individual pressure chambers 80 from the supply ports 27.

In the module substrate 55, the energy generating elements 18 are arranged in positions corresponding to the respective ejection openings 17. The energy generating element 18 may be any element capable of generating energy for ejecting the ejection material as a fine droplet (such as a droplet of 1 pL). The energy generating element 18 is, for example, a piezoelectric element or a heat resistor (heater element).

For example, in the case of using a piezoelectric element as the energy generating element, the control unit 16 controls the piezoelectric element using a drive signal to change the volume in the individual pressure chamber 80 by a diaphragm or the like and eject the ejection material from the individual pressure chamber 80 through the ejection opening 17.

The electric substrate 50 shown in FIG. 2 is a substrate electrically connected to the control unit 16 and configured to supply a drive signal to the ejection unit 13 to control ejection of the ejection material. In the present embodiment, the electric substrate 50 is provided above the storage container 19 in the vertical direction (in the +Z direction, or above in the vertical direction in the orientation of the ejection material ejecting device in use) to prevent current leakage due to adherence of the ejection material. On the other hand, the ejection unit 13 is provided below the storage container 19 in the vertical direction (−Z direction) to eject the imprint material 40. As a result, the electric substrate 50 is provided above the ejection unit 13 at a distance.

For ejection of the ejection material, the electric substrate 50 and the ejection unit 13 are required to be electrically connected to each other by a wiring member. In the present embodiment, a flexible cable that is flexible and largely deformable is used as the wiring member for connecting the electric substrate 50 to the ejection unit 13. However, the electric substrate 50 and the ejection unit 13 are provided at a distance. Further, there are various members between the electric substrate 50 and the ejection unit 13, which may interfere with direct connection by the flexible cable between the electric substrate 50 and the ejection unit 13. Thus, a first flexible cable 53 and a second flexible cable 51 are joined at a joint 63 to electrically connect the electric substrate 50 to the ejection unit 13. The first flexible cable 53 is electrically connected to the ejection unit 13 by wire bonding or the like. The second flexible cable 51 is electrically connected to the electric substrate 50. In this manner, the ejection unit 13 and the electric substrate 50 can be electrically connected to each other.

For electrical connection between the first flexible cable 53 and the second flexible cable 51, the first flexible cable 53 and the second flexible cable 51 are joined by a conductive adhesive member or the like. In the present embodiment, an anisotropic conductive film 52 that is an anisotropic conductive material is used to join the first flexible cable 53 and the second flexible cable 51.

Figure 4A:
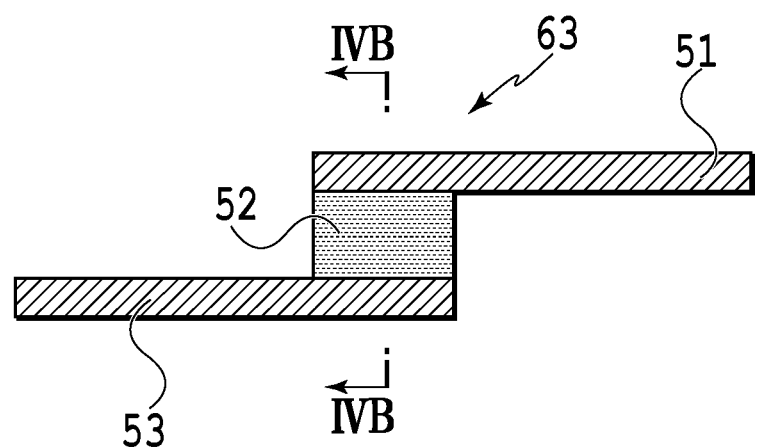
FIGS. 4A and 4B are diagrams showing connection by an anisotropic conductive film.
Figure 4B:
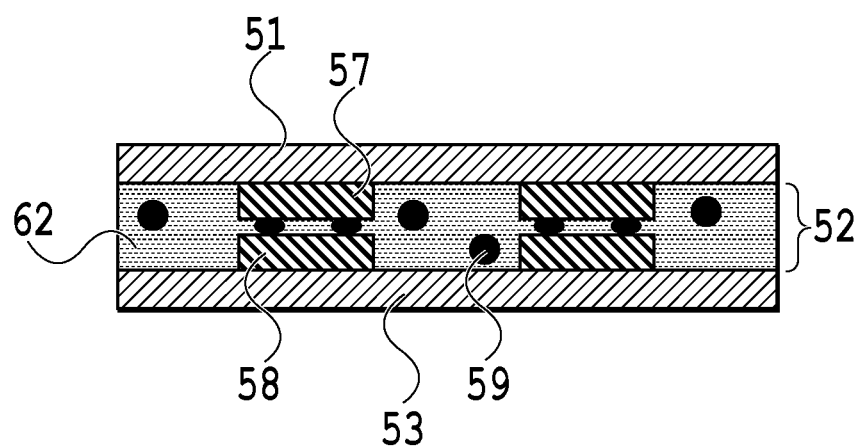

FIG. 4A is an enlarged view of the joint 63 between the first flexible cable 53 and the second flexible cable 51. FIG. 4B is a cross-sectional view along section line IVB-IVB in FIG. 4A showing the cross section of the joint 63 using the anisotropic conductive film 52. As shown in FIG. 4B, the anisotropic conductive film 52 includes at least conductive particles 59 and an adhesive agent 62. For example, the conductive particles 59 are nickel particles each having a particle size of 2 to 6 μm. The main ingredient of the adhesive agent 62 is, for example, epoxy resist. The anisotropic conductive film 52 is used to pressure-bond a first electrode pad 58 of the first flexible cable 53 to a second electrode pad 57 of the second flexible cable 51. The first electrode pad 58 and the second electrode pad 57 are thus electrically connected to each other via the conductive particles 59. Accordingly, the anisotropic conductive film 52 enables excellent electrical connection between the first flexible cable 53 and the second flexible cable 51 as well as fixing of the joint 63.

In a case where the first electrode pad 58 and the second electrode pad 57 are joined by pressure bonding with a misalignment therebetween, the first flexible cable 53 and the second flexible cable 51 are not electrically connected to each other. In this case, repair is performed. The anisotropic conductive film 52 is configured to dissolve in a solvent for repair (such as acetone). Thus, after the joint 63 is released using the solvent for repair, the misalignment between the first electrode pad 58 and the second electrode pad 57 is corrected, the anisotropic conductive film 52 is sandwiched between the pads, and pressure bonding is performed again to join the pads. In this manner, even in the case of a misalignment between the first electrode pad 58 and the second electrode pad 57, the first flexible cable 53 and the second flexible cable 51 can be electrically connected and fixed to each other by performing repair.

However, the anisotropic conductive film 52 is often not resistant to the ejection material. For example, the adhesive agent 62 of the anisotropic conductive film 52 is not resistant to the imprint material 40. Accordingly, in a case where the ejection material ejected from the ejection opening 17 reaches the joint 63, there is a possibility that the ejection material contacts the anisotropic conductive film 52, the anisotropic conductive film 52 dissolves, and the joint 63 is released. The release of the joint 63 causes a misalignment between the first electrode pad 58 and the second electrode pad 57 and makes it impossible to maintain electrical connection between the ejection unit 13 and the electric substrate 50.

For example, at the time of delivery of the ejecting device 10 or mounting of the ejecting device 10 on the imprint apparatus 101, the ejection material storage unit 100 may be tilted. In a case where the ejection material storage unit 100 is tilted with an ejection material droplet adhering to the vicinity of the ejection opening 17, the ejection material may reach the joint 63 through the first flexible cable 53. Further, the ejecting device 10 mounted on the imprint apparatus 101 may pressurize the inside of the ejection material storage chamber 8 using the pressure control unit 20 to discharge foreign matter or a bubble adhering to the vicinity of the ejection opening 17. Also in this case, the ejection material may reach the joint 63 through the ejection opening 17.

In the ejection material storage unit 100 after assembly, the first flexible cable 53 is connected to the ejection unit 13. The second flexible cable 51 is similarly connected to the electric substrate 50. In such a state where the first flexible cable 53 and the second flexible cable 51 are connected to the ejection material storage unit 100, it is difficult to repair the joint 63. Therefore, for repair of the joint 63 in the ejection material storage unit 100 after assembly, the first flexible cable 53 and the second flexible cable 51 must be removed from the ejection material storage unit 100. For this reason, in a case where the ejection material reaches the joint 63 and the joint is released, repair requires time and cost.

Figure 5A:
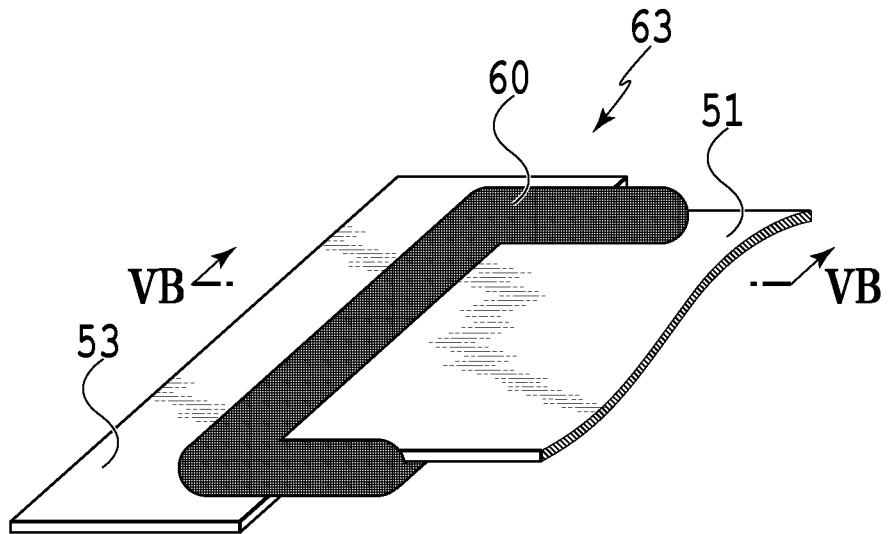
FIGS. 5A and 5B are diagrams showing the anisotropic conductive film of a joint covered with a sealant.
Figure 5B:
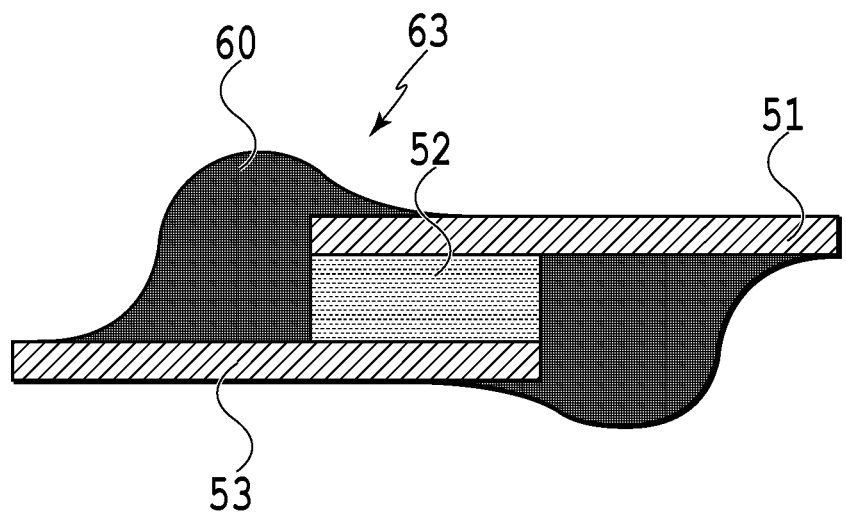

FIGS. 5A and 5B are enlarged views of the vicinity of the joint 63 between the first flexible cable 53 and the second flexible cable 51 of the present embodiment. FIG. 5A is an external perspective view of the vicinity of the joint 63. In the present embodiment, in order to prevent the ejection material from contacting the anisotropic conductive film 52 of the joint 63, the joint 63 is covered with a sealant 60 so as to cover the anisotropic conductive film 52. The sealant 60 used in the present embodiment is a sealant resistant to the ejection material. The sealant is at least less soluble in the ejection material than the anisotropic conductive film 52. Being resistant to the ejection material means having a change in weight of less than 5% after immersion in the ejection material for one year. The sealant 60 is, for example, a thermosetting adhesive agent having epoxy as the main ingredient. More specifically, CV5788FL, CV5788FM, CV5420D (made by Panasonic) or the like may be used.

FIG. 5B is an enlarged cross-sectional view along section line VB-VB in FIG. 5A. As shown in FIG. 5B, the anisotropic conductive film 52 is covered and sealed with the sealant 60 resistant to the ejection material. In the present embodiment, the anisotropic conductive film 52 is covered with the sealant 60 resistant to the imprint material 40. Thus, even in a case where the ejection material reaches the joint 63, the ejection material can be prevented from contacting the anisotropic conductive film 52. As a result, even in a case where the ejection material reaches the joint 63, electrical connection between the ejection unit 13 and the electric substrate 50 can be maintained.

Figure 6A:
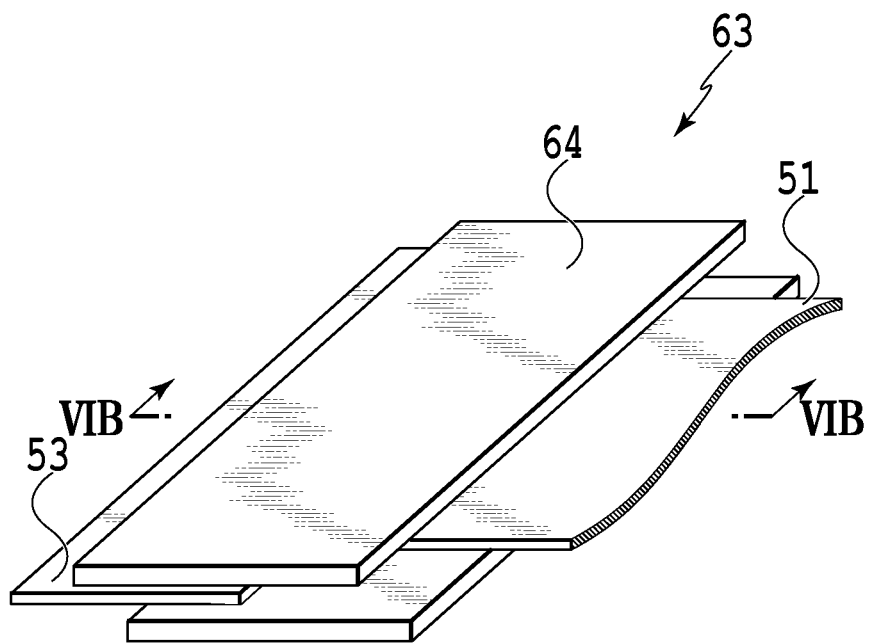
FIGS. 6A and 6B are diagrams showing a member covering the sealant.
Figure 6B:
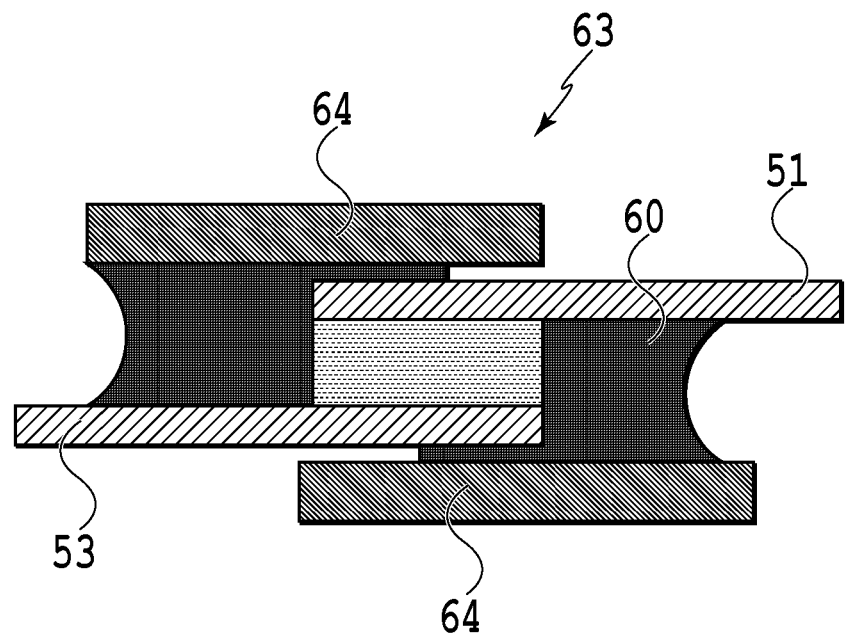

FIGS. 6A and 6B are enlarged views of the vicinity of the joint 63 between the first flexible cable 53 and the second flexible cable 51. FIG. 6A is an external perspective view of the vicinity of the joint 63 and FIG. 6B is an enlarged cross-sectional view along section line VIB-VIB in FIG. 6A.

The flexible cable is flexible and bendable. Further, the sealant 60 is often applied as a thin film. Thus, for example, in a case where the joint 63 sealed with the sealant 60 is mounted on the ejecting device 10 in a bent state, there is a possibility that the cured sealant 60 is cracked or peeled from the joint 63. In this case, the ejection material may enter into a portion in which the sealant 60 is cracked or peeled and contact the anisotropic conductive film 52.

Thus, in order to prevent cracking of the sealant 60, the sealant 60 may be further brought into intimate adhesiveness with and covered with a member 64 resistant to the ejection material as shown in FIGS. 6A and 6B. As the member 64, a member more rigid than the cured sealant 60 is used. The member 64 can thus prevent bending of the joint 63 and cracking of the sealant 60. In addition, adhesiveness between the member 64 and the sealant 60 is more intimate than adhesiveness between the member 64 and the first flexible cable 53 that is the wiring member or adhesiveness between the member 64 and the second flexible cable 51. The member 64 can thus be prevented from being peeled from the sealant 60. As the material for the member 64, it is preferable to use stainless metal or resin such as plastic.

As described above, according to the present embodiment, even in a case where the ejection material adheres to the joint of wiring connecting the ejection unit to the electric substrate, the joint can be prevented from being released. Therefore, according to the present embodiment, electrical connection between the ejection unit and the electric substrate can be maintained.

Other Embodiments

The ejection material ejecting device described above ejects the imprint material as the ejection material. The ejection material ejecting device of the above embodiment is also applicable to apparatus such as a printer, a copier, a facsimile with a communication system, and a word processor with a printer unit, and an industrial recording apparatus obtained by combining various processing devices. For example, the ejection material ejecting device may be used for biochip manufacture or electronic circuit printing. The ejection material ejecting device is also applicable to an apparatus configured to eject the ejection material and then planarize the ejected ejection material using a planar mold.

According to the technique of this disclosure, electrical connection between the ejection unit and the electric substrate can be maintained.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2019-085554 filed Apr. 26, 2019, which are hereby incorporated by reference wherein in their entirety.

What is claimed is:

1. An ejection material ejecting device comprising:
a storage container configured to store an ejection material, which is an imprint material for imprint processing of transferring a pattern of a mold to the imprint material applied to a substrate;
an ejection unit provided below the storage container in a vertical direction in an orientation of the ejection material ejecting device in use, and comprising an ejection opening configured to eject the ejection material;
an electric substrate configured to control ejection of the ejection material and provided above the storage container in the vertical direction and in direct contact with the storage container;
a first wiring member connected to the ejection unit;
a second wiring member connected to the electric substrate; and
a joint at which the first wiring member and the second wiring member are joined by an anisotropic conductive material, the joint being covered with a sealant resistant to the ejection material.

2. The ejection material ejecting device according to claim 1, wherein the sealant is an adhesive agent resistant to the ejection material.

3. The ejection material ejecting device according to claim 2, wherein the adhesive agent is a thermosetting adhesive agent having epoxy as a main ingredient.

4. The ejection material ejecting device according to claim 1, wherein the ejection material includes at least a first component that is a polymerization compound.

5. The ejection material ejecting device according to claim 4, wherein the first component is a radical polymerization compound.

6. The ejection material ejecting device according to claim 1, wherein at the joint, the sealant is further covered with a member resistant to the ejection material.

7. The ejection material ejecting device according to claim 6, wherein the member is more rigid than the sealant.

8. The ejection material ejecting device according to claim 6, wherein a material for the member is stainless metal or plastic.

9. The ejection material ejecting device according to claim 1, wherein the first wiring member and the second wiring member are flexible cables.

10. The ejection material ejecting device according to claim 1, wherein the first wiring member comprises a first electrode pad, the second wiring member comprises a second electrode pad, and at the joint, the first electrode pad and the second electrode pad are electrically connected to each other by the anisotropic conductive material.

11. An imprint apparatus comprising an ejection material ejecting device, the ejection material ejecting device comprising:
a storage container configured to store an ejection material, which is an imprint material for imprint processing of transferring a pattern of a mold to the imprint material applied to a substrate;
an ejection unit provided below the storage container in a vertical direction in an orientation of the ejection material ejecting device in use, and comprising an ejection opening configured to eject the ejection material;
an electric substrate configured to control ejection of the ejection material and provided above the storage container in the vertical direction and in direct contact with the storage container;
a first wiring member connected to the ejection unit;
a second wiring member connected to the electric substrate; and
a joint at which the first wiring member and the second wiring member are joined by an anisotropic conductive material, the joint being covered with a sealant resistant to the ejection material.

12. The imprint apparatus according to claim 11, wherein the sealant is an adhesive agent resistant to the ejection material.

13. The imprint apparatus according to claim 12, wherein the adhesive agent is a thermosetting adhesive agent having epoxy as a main ingredient.

14. The imprint apparatus according to claim 11, wherein the ejection material includes at least a first component that is a polymerization compound.

15. The imprint apparatus according to claim 14, wherein the first component is a radical polymerization compound.

16. The imprint apparatus according to claim 11, wherein at the joint, the sealant is further covered with a member resistant to the ejection material.

* * * * *